(12) United States Patent
Yoda et al.

(10) Patent No.: US 8,119,927 B2
(45) Date of Patent: Feb. 21, 2012

(54) WIRING BOARD, METHOD FOR MANUFACTURING THE SAME, AND SEMICONDUCTOR PACKAGE

(75) Inventors: Toshihisa Yoda, Nagano (JP); Shunichiro Matsumoto, Nagano (JP); Masako Sato, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 353 days.

(21) Appl. No.: 12/464,307

(22) Filed: May 12, 2009

(65) Prior Publication Data
US 2009/0284943 A1 Nov. 19, 2009

(30) Foreign Application Priority Data
May 15, 2008 (JP) ................................. 2008-128196

(51) Int. Cl.
*H05K 1/16* (2006.01)
(52) U.S. Cl. ...................................................... 174/260
(58) Field of Classification Search .......... 174/260–262; 361/760, 792–795
See application file for complete search history.

(56) References Cited

U.S. PATENT DOCUMENTS
2008/0173473 A1* 7/2008 Hirose et al. .................. 174/266

FOREIGN PATENT DOCUMENTS
JP 2000-244125 9/2000
JP 2003-152311 5/2003
* cited by examiner

*Primary Examiner* — Javaid Nasri
(74) *Attorney, Agent, or Firm* — Drinker Biddle & Reath LLP

(57) ABSTRACT

In a wiring board, a plurality of wiring layers and a plurality of insulating layers are alternately stacked. The wiring layers are electrically connected to one another through via holes formed in the insulating layers. The wiring board includes: a connection pad which is disposed on one of the wiring layers that is on the inner side of an outermost wiring layer; and an external connection terminal which is disposed on the connection pad, and which is projected from the surface of the wiring board. The external connection terminal is passed through the outermost wiring layer.

14 Claims, 21 Drawing Sheets

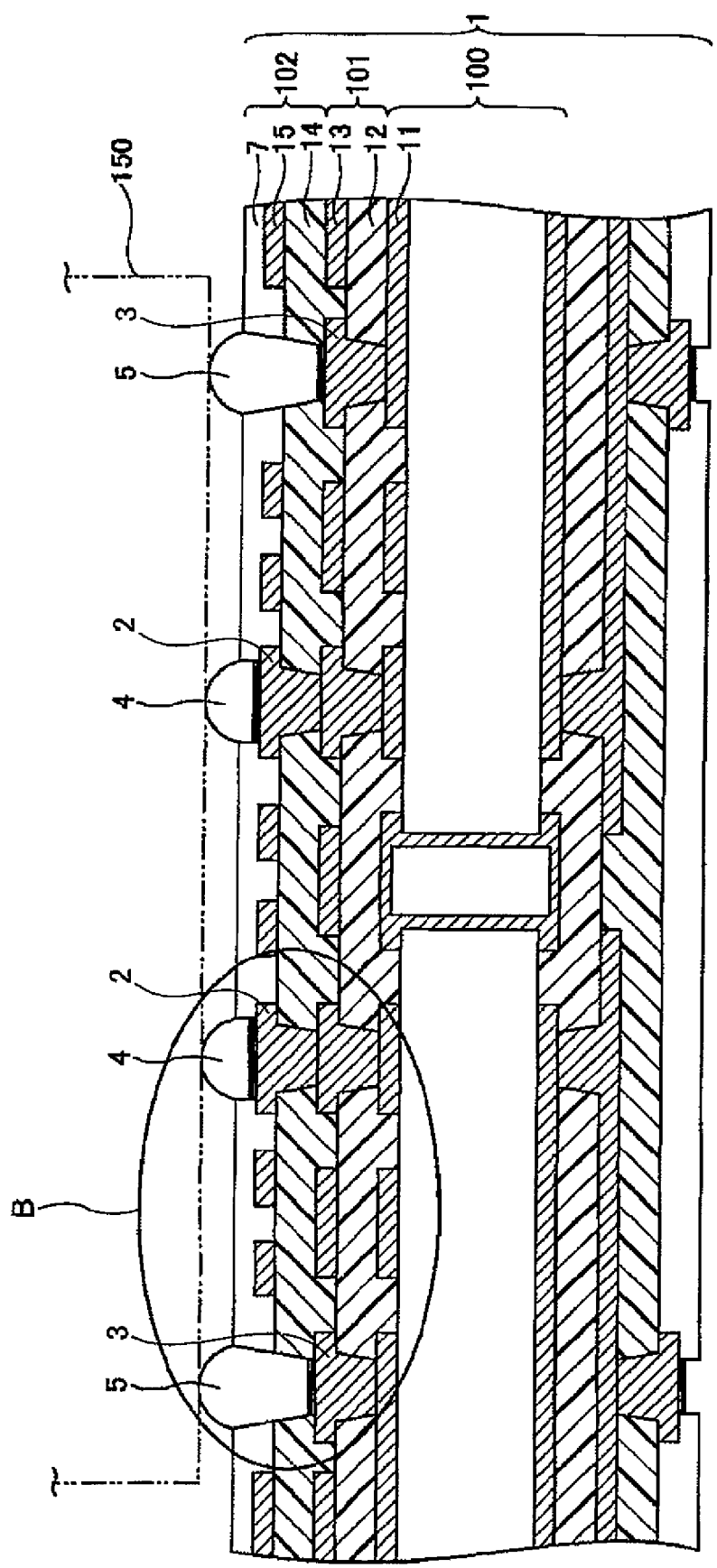

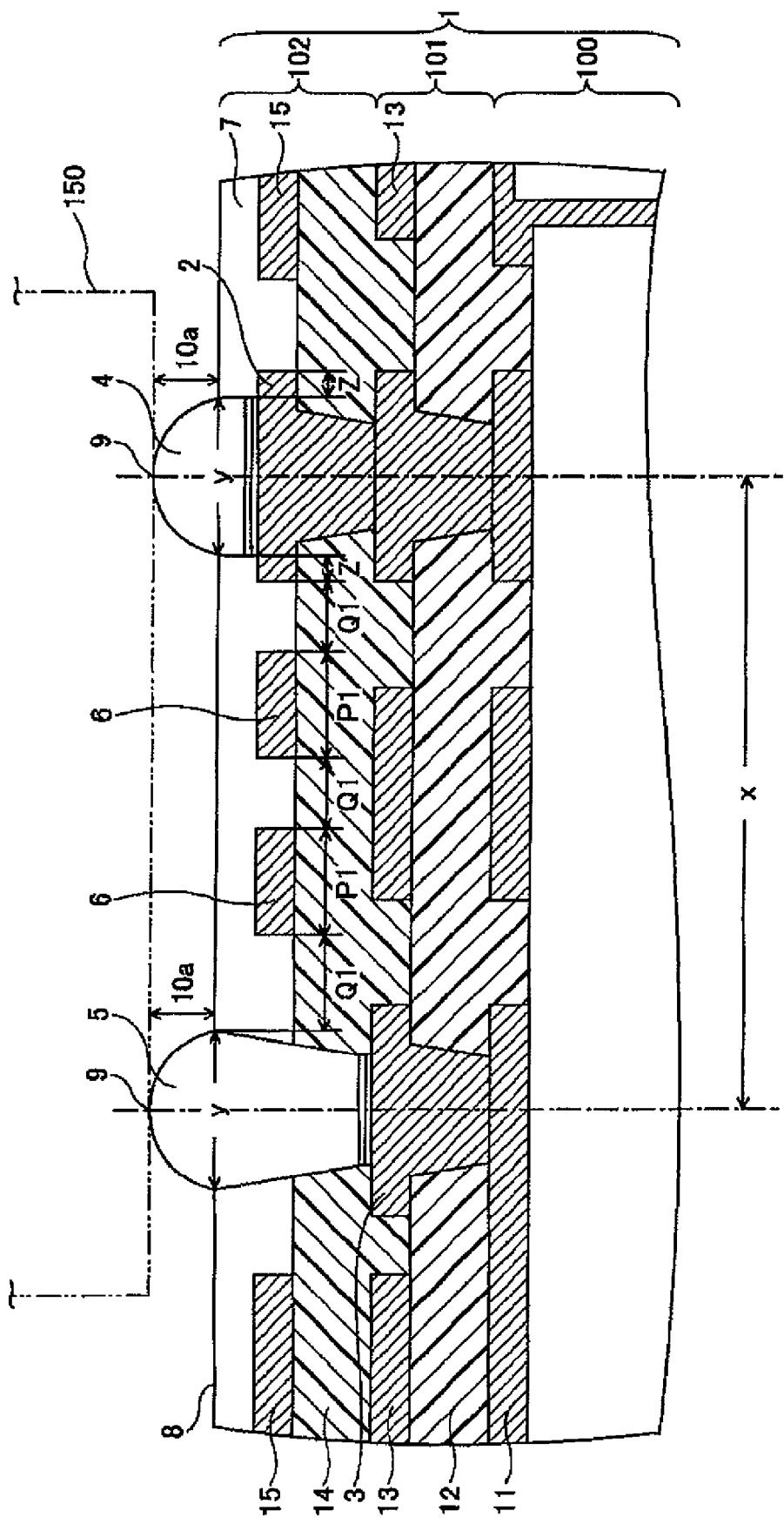

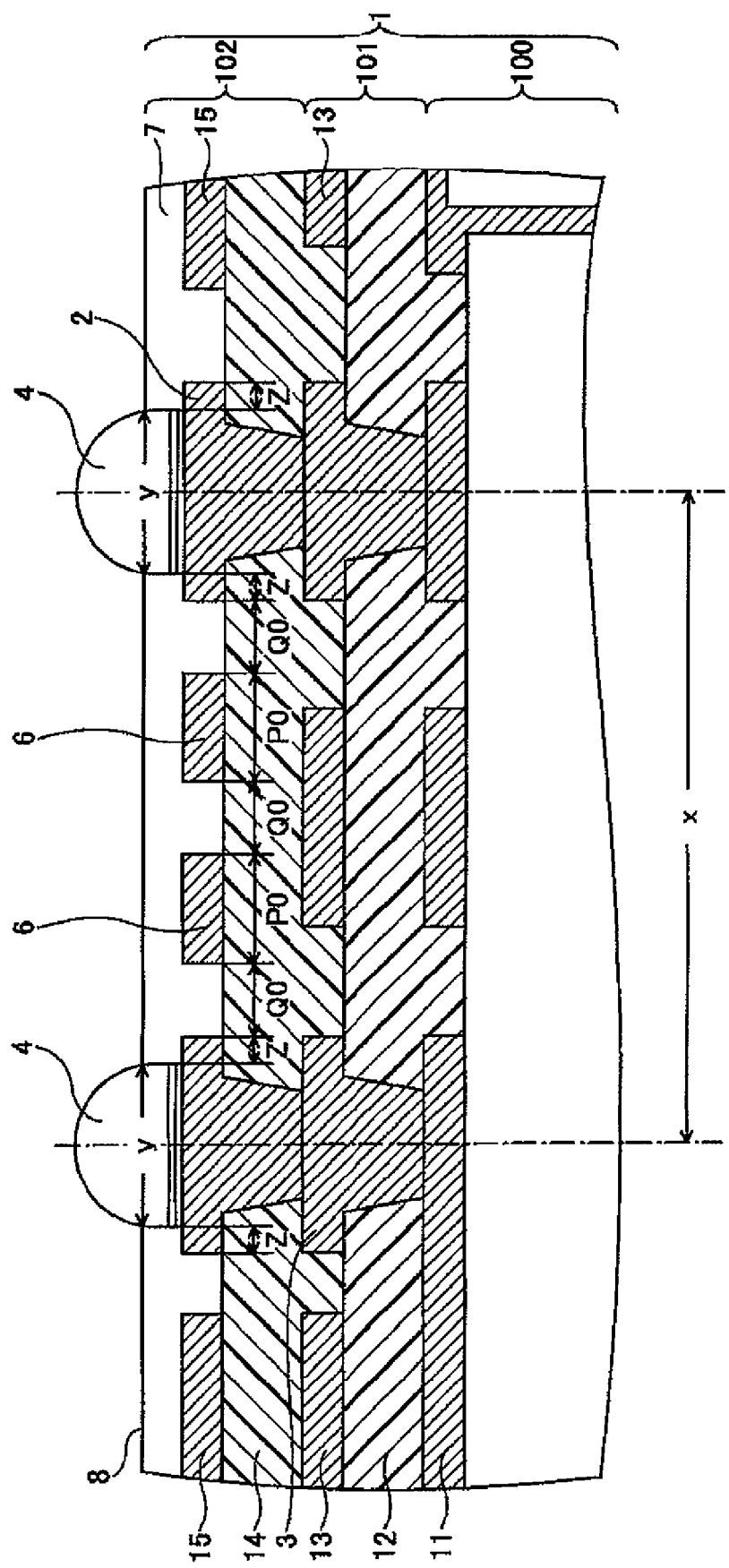

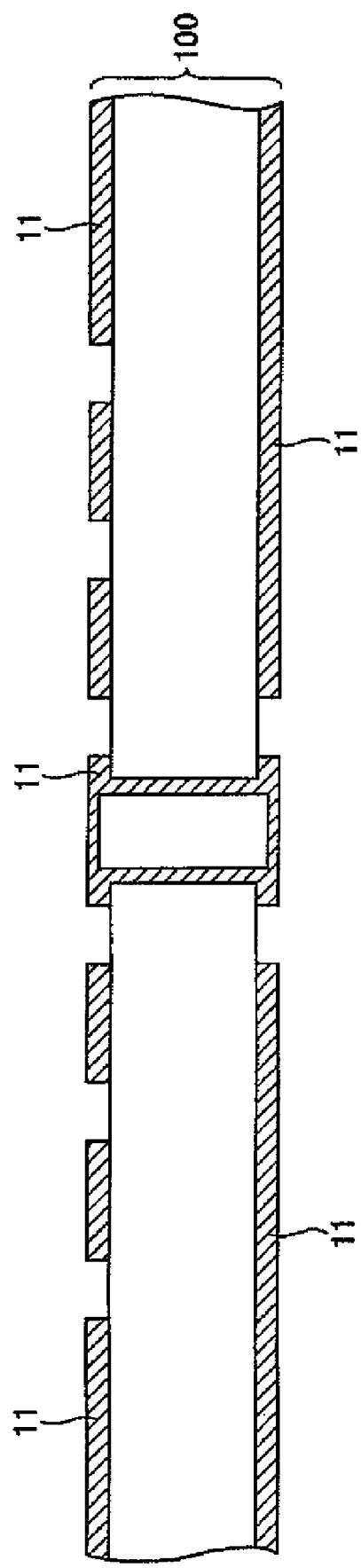

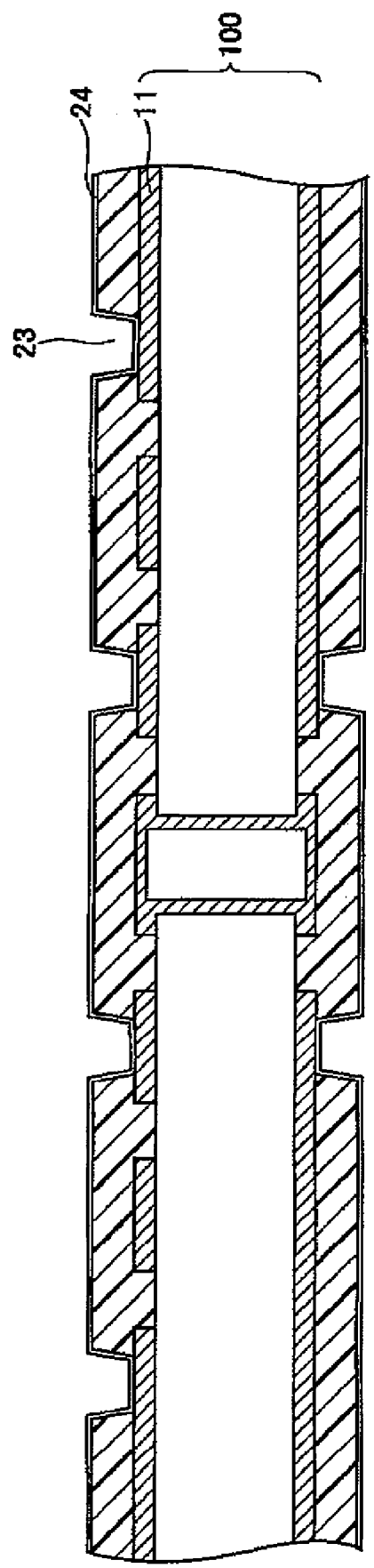

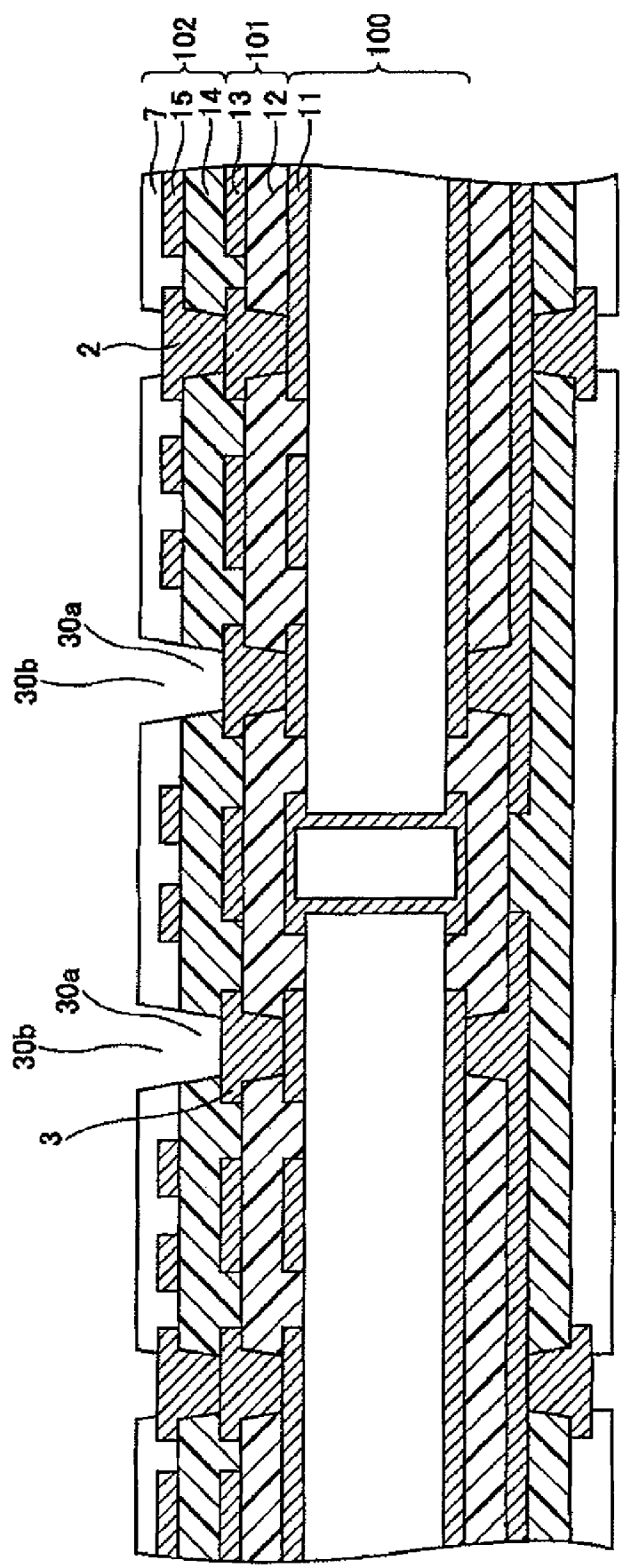

WIRING BOARD, METHOD FOR MANUFACTURING THE SAME, AND SEMICONDUCTOR PACKAGE

This application claims priority from Japanese Patent Application No. 2008-128196, filed on May 15, 2008, the entire contents of which are hereby incorporated by reference.

FIELD OF THE INVENTION

The present disclosure relates to a wiring board in which a plurality of wiring layers and a plurality of insulating layers are alternately stacked, and the wiring layers are electrically connected to one another through via holes formed in the insulating layers, a method for manufacturing the wiring board, and a semiconductor package.

DESCRIPTION OF RELATED ART

Associated with a request for enhancement in performance and function of an information and communication apparatus, semiconductor packages serving as central electronic components of the apparatus realizing the function are highly densely mounted. In accordance with the highly densely mounting, a mounting density on a wiring board for mounting semiconductor chips or semiconductor devices are increased. As a board for a purpose of the mounting density, usually, a multi-layer wiring board is used in which a plurality of wiring layers and a plurality of insulating layers are alternately stacked, and the wiring layers are electrically connected to one another through via holes formed in the insulating layers. According to high integration of a semiconductor chip to be mounted on the board, and a narrow pitch of terminals of a semiconductor device which are to be connected to the board, also connection terminals of the wiring board must be miniaturized. In wirings of an outermost layer of the board, particularly, the wiring density is requested to be maximized. Specifically, with respect to a design rule of the wirings of the outermost layer, for example, a positional accuracy between connection pads for external connection terminals, and solder resist openings of the surface is enhanced. For example, a Japanese Unexamined Patent Application Publication No. JP-A-2003-152311 discloses a method for manufacturing a related-art wiring board in which openings are accurately formed by using photolithography and laser. A Japanese Unexamined Patent Application Publication No. JP-A-2000-244125 discloses a method for manufacturing the related-art wiring board in which openings are formed by using laser and without using a photosensitive resin as a material of a solder resist layer.

In a design of the wirings of the outermost layer of the related-art wiring board, a margin of each connection pad having a circular shape or the like is covered by a solder resist layer. Therefore, openings of the solder resist layer corresponding to the connection pad must be accurately formed, and the formation accuracy affects the design rule of the wiring density of the board surface. In order to improve the formation accuracy of the openings, as disclosed in JP-A-2003-152311 and JP-A-2000-244125, the laser technique is used. However, in the related-art method, the wiring density cannot be further enhanced.

SUMMARY OF INVENTION

Illustrative aspects of the present invention provide a wiring board in which wirings of an outermost wiring layer of the wiring board can be formed in a high density, a method for manufacturing the same, and a semiconductor package.

According to a first illustrative aspect of the invention, a wiring board is provided with a plurality of wiring layers, a plurality of insulating layers which are alternately stacked with the wiring layers, and in which the wiring layers are electrically connected to one another through via holes formed in said insulating layers, a connection pad which is disposed on at least one of the wiring layers that is on an inner side of an outermost wiring layer, and an external connection terminal which is disposed on the connection pad, and which is projected from a surface of the wiring board. The external connection terminal is passed through the outermost wiring layer.

BRIEF DESCRIPTION OF THE DRAWINGS

FIG. 1D is a view showing a section of the wiring board 1 taken along a cutting line A-A (FIG. 1B) including a center of adjacent connection pads, in the first embodiment.

FIG. 1E is a view showing in detail a "B" portion in FIG. 1C.

FIG. 2C is a view showing a section of the related-art wiring board 1b taken along a cutting line D-D (FIG. 2A) including a center of adjacent connection pads.

FIG. 10A is a view showing a state of formation of wirings of a core, in a method for manufacturing a wiring board of a third embodiment of the invention.

FIG. 10C is a view showing a state where electroless copper plating 24 is applied, in the method for manufacturing the wiring board of the third embodiment.

FIG. 10G is a view showing a state where a solder resist layer 7 is formed in the surface of the board, in the method for manufacturing the wiring board of the third embodiment.

DETAILED DESCRIPTION OF EXEMPLARY EMBODIMENTS

Hereinafter, exemplary embodiments of the present invention will be described with reference to FIGS. 1A to 10I.

First Embodiment

In a first embodiment of the present invention, external connection terminals which are passed through an outermost wiring layer will be described.

Figure 1A:
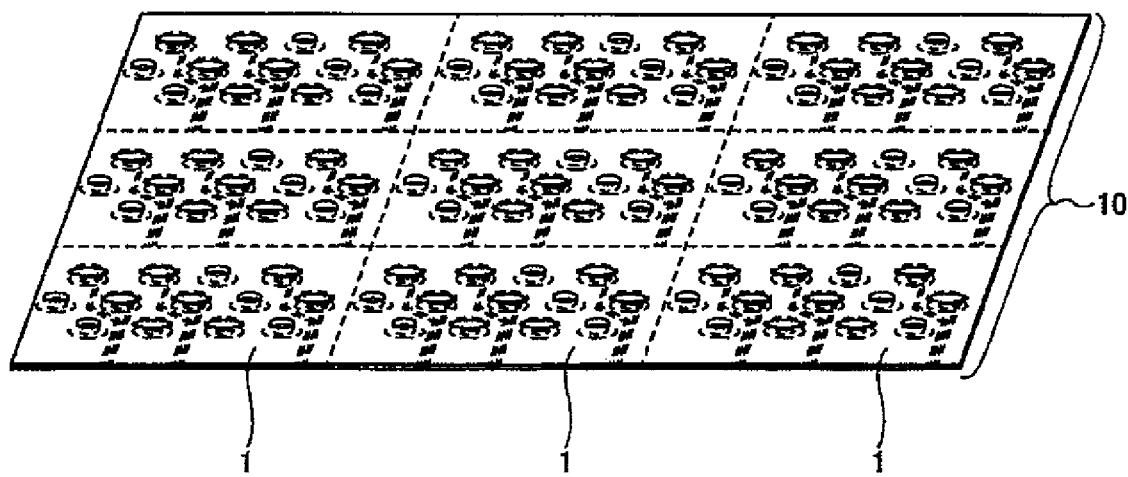
FIG. 1A is a view showing a wiring board sheet 10 of the present invention in a mass production step.

FIG. 1A shows a wiring board sheet of the first embodiment in a mass production process. After a stacking step, the wiring board sheet 10 is cut and divided along broken lines into individual wiring boards 1, thereby being to be used as final products, and thereby being incorporated into electronic apparatuses.

Figure 1B:
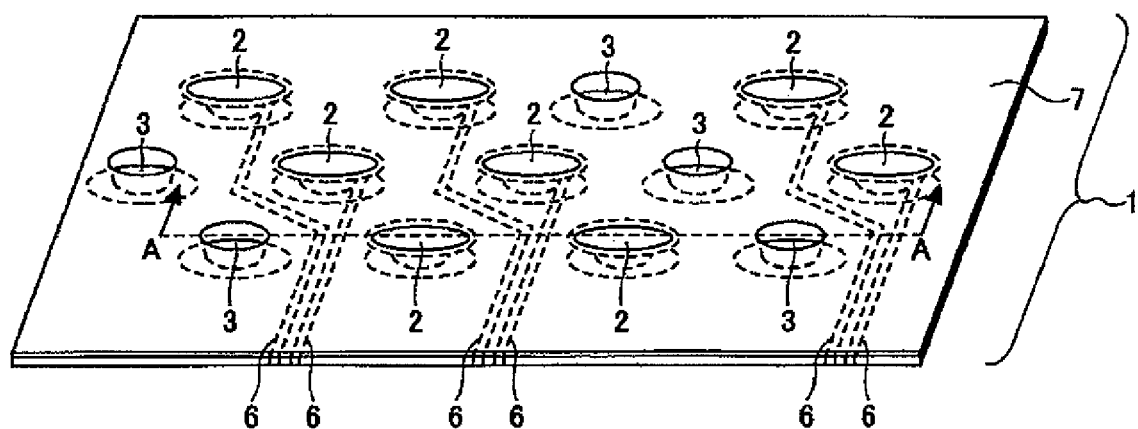
FIG. 1B is a view showing a surface of a wiring board 1 of a first embodiment of the present invention.

FIG. 1B shows a surface of the wiring board 1. The surface of the wiring board 1 is formed by connection pads 2, connection pads 3 which are disposed on an inner wiring layer, wirings 6, and a solder resist layer 7.

Figure 1C:
FIG. 1C is a view showing external connection terminals which are disposed on connection pads in the first embodiment.

FIG. 1C shows external connection terminals 4, 5 which are disposed on the connection pads 2, 3, respectively, and which are projected from the surface of the wiring board 1. Similarly, other external connection terminals are connected also to other connection pads. Solder bumps are used as the external connection terminals.

FIG. 1D is a sectional view of the wiring board 1 along a cutting line A-A in FIG. 1B. The cutting line A-A includes centers of the connection pads 2, 3 which are adjacent to one another. The first embodiment provides the wiring board 1 configured by six layers in which three layers are stacked on each side of a core layer. The wiring board 1 includes a core layer 100, a wiring layer 11 on the core layer 100, a first insulating layer 12, a second wiring layer 13 on the core layer 100, a second insulating layer 14, a third wiring layer (outermost wiring layer) 15 on the core layer 100, the solder resist layer 7, and the external connection terminals 4, 5. A shape of a semiconductor chip or semiconductor device 150 which is to be mounted on the wiring board 1 is indicated by a dash-dot-dot line. In the stacked structure, the first insulating layer 12 and the second wiring layer 13 are deemed as one set of layers which is referred to as "second layer 101 on the core layer". The second insulating layer 14, the third wiring layer 15, and the solder resist layer 7 are deemed as one set of layers which is referred to as "third layer 102 on the core layer". In the first embodiment, the third layer 102 on the core layer 100 is an outermost layer of the wiring board 1, and hence the third layer 102 is hereinafter called "outermost layer 102". Similarly, also the third wiring layer 15 on the core layer 100 is an outermost wiring layer, and hence the third wiring layer 15 is hereinafter called "outermost wiring layer 15".

FIG. 1E is a detail view of a "B" portion in FIG. 1D, and shows the structures of the connection pads, the wirings, the insulating layers, and the external connection terminals in the vicinity of the outermost layer 102. The external connection terminals 4, 5 which are adjacent to each other across the wirings 6 are disposed on the outermost layer 102. The external connection terminal 4 is disposed on the connection pad 2, and projected from a board surface 8 of the outermost layer 102 which has the solder resist layer 7 in the board surface 8. The external connection terminal 5 is disposed on the connection pad 3 on the wiring layer (in the first embodiment, the second wiring layer on the core layer) 13 which is on an inner side of the outermost wiring layer 15, and passed through the outermost layer 102 to be projected from the board surface 8. In order that a connection state of the semiconductor chip or semiconductor device 150 is substantially parallel to the board surface 8, a height 10a of a top portion 9 of the external connection terminal 4 from the board surface 8 is at the same level as a height 10a of a top portion 9 of the external connection terminal 5 from the board surface 8.

The connection pads 3 are disposed in the second wiring layer 13 on the core layer 100 which is on the inner side of the outermost wiring layer 15. Alternatively, the connection pads 3 may be disposed in the wiring layer 11 on the core layer which is further on the inner side of the outermost wiring layer 15. In the case of which a wiring layer is further disposed on the inner side, the connection pads 3 may be disposed on the further inner-side wiring layer. In accordance with the design conditions, the number of stacked layers can be increased or decreased. A stack structure of a rear face side of the core layer 100 may be formed to be identical with the above-described stack of the three layers, and hence its detailed description is omitted. Alternatively, the wiring board of the present invention may be provided with a configuration in which a plurality of wirings are stacked without a core layer.

Effects of First Embodiment

Effects of the first embodiment on enhancement of the wiring density in the outermost wiring layer 15, and on improvement of reliability will be described. For the sake of comparison, a wiring structure of a related-art wiring board is shown in FIGS. 2A to 2C.

Figure 2A:
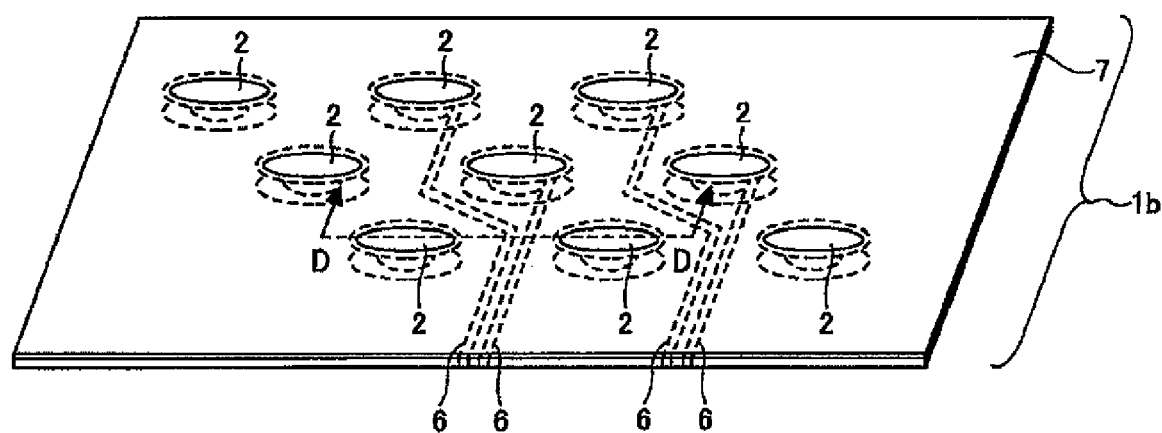
FIG. 2A is a view showing a surface of a related-art wiring board 1b.
Figure 2B:
FIG. 2B is a view showing an external connection terminal of the related-art wiring board 1b.

FIG. 2A shows a surface of a related-art wiring board 1b in a similar manner as FIG. 1B. The surface of the wiring board 1b is formed by connection pads 2, wirings 6, and solder resist layer 7. FIG. 2B shows an external connection terminal 4 which is disposed on the connection pad 2, and which is projected from the surface of the wiring board 1b. Similarly, other external connection terminals 4 are connected also onto other connection pads 2.

FIG. 2C is a sectional detail view of the related-art wiring board 1b taken along a cutting line D-D in FIG. 2A, and corresponds to FIG. 1E. With respect to the wirings 6 in the outermost wiring layer 15, particularly, FIG. 2C shows mutual relationships among the connection pads 2, a bump pitch x [μm], and a length z [μm] of a pad overlapping portion with the solder resist. In a related-art wiring design of the outermost wiring layer, wirings are disposed at middle positions between adjacent wiring pads in a narrow portion where the wiring width is near the minimum allowable design value. The bump pitch is indicated by x [μm], an opening diameter of the solder resist is indicated by y [μm], and the length of the pad overlapping portion with the solder resist is indicated by z [μm]. Usually, a width P0 [μm] of the wirings is set to be equal to a width Q0 [μm] of an insulating portion between the wirings. In an example where two wirings are placed at middle positions, therefore, the wiring width P0 is given by P0={x−(y+2×z)}/5 from the interval configuration consisting of two wirings and three insulating portions as shown in FIG. 2B. P0=15 μm is obtained, when x=185 μm, y=90 μm, and z=10 μm.

In the first embodiment, an example where two wirings are placed in the narrow portion of FIG. 1E which is similar to the above-described related-art wiring design will be described. From the interval configuration consisting of two wirings and three insulating portions, a wiring width P1 is given by P1={x−(y+z)}/5. In an actual manufacturing example, P1=17 μm is obtained, when the bump pitch x is 185 μm, the solder resist opening diameter y is 90 μm, and the length z, of the pad overlapping portion with the solder resist, is 10 μm. As compared with the related-art wiring of P0=15 μm, the wirings of the first embodiment can have a margin of 2 μm. Therefore, a conduction failure due to lack of the wiring width, and an insulation failure due to a narrow width of the insulating portion can be suppressed. In accordance with the request for high-density mounting of semiconductor devices, wirings are set so as to have a narrow width at which the conduction resistance of the wirings and the insulation resistance of the insulating layer are in the vicinity of the respective allowable design values. In the first embodiment, a high density arrangement of wirings in the outermost layer can be realized without reducing the reliability.

Modification of First Embodiment

Figure 4:
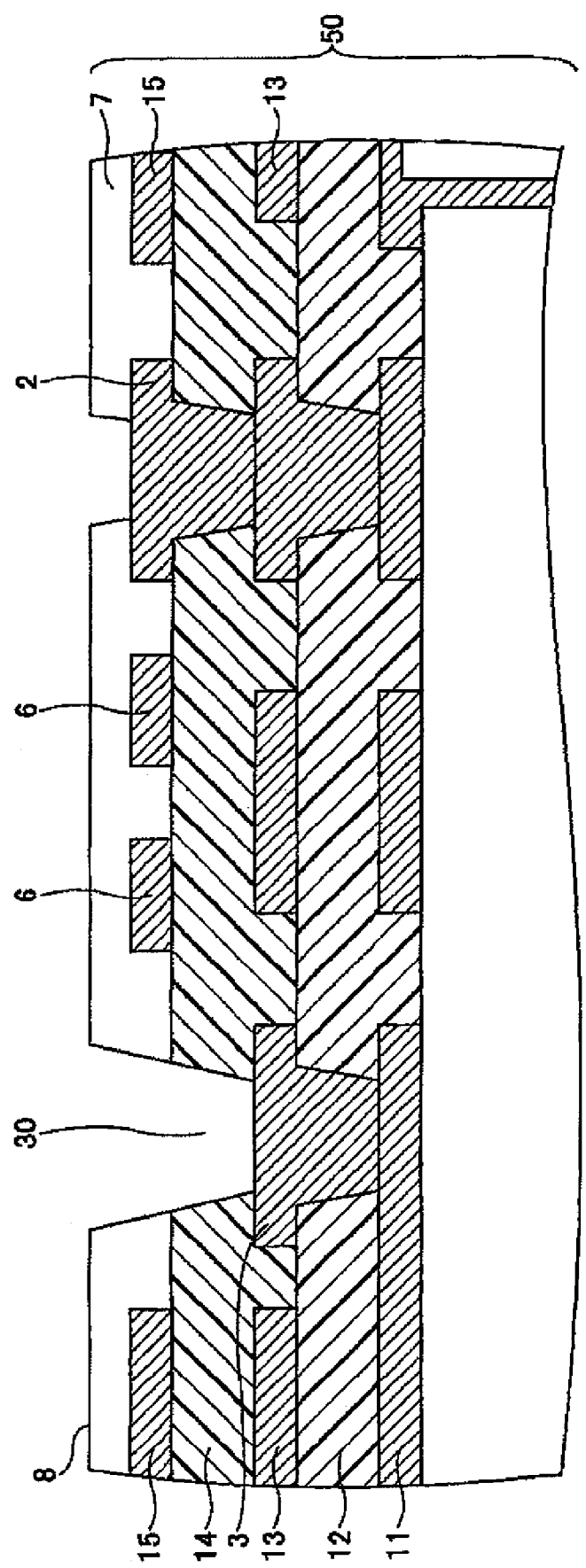
FIG. 4 is a view showing a section of a wiring board 50 of a modification of the first embodiment.

FIG. 4 is a sectional view of the vicinity of the outermost layer in a wiring board corresponding to FIG. 1E, and shows a state where the external connection terminals have not yet been disposed. In the case where external connection terminals such as solder bumps are connected to connection terminals of a semiconductor chip or a semiconductor device, it is not necessary to form the external connection terminals which are projected from the surface of the wiring board. Therefore, as shown in FIG. 4, it is possible to use a wiring board 50 having spaces 30 into which external connection terminals are inserted.

Application Example 1 of First Embodiment

Figure 5:
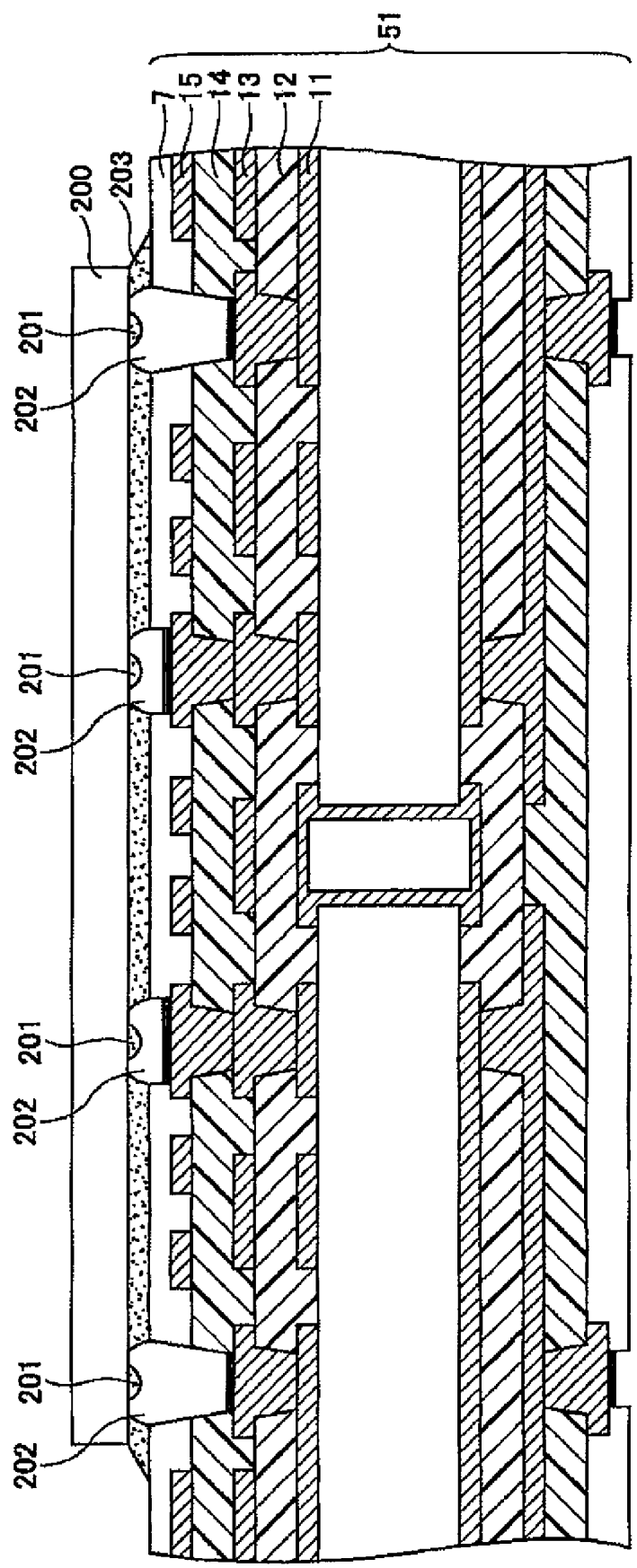
FIG. 5 is a view showing a semiconductor package in which a semiconductor chip 200 is mounted on a wiring board 51, in application example 1 of the first embodiment.

FIG. 5 shows an exemplary embodiment of a semiconductor package structure in which a semiconductor chip 200 is mounted by solder bumps on the wiring board of the invention. The semiconductor package structure includes the semiconductor chip 200, connection terminals 201 of the semiconductor chip 200, external connection terminals 202 such as solder bumps, a filling resin 203, and a wiring board 51. In the case where, before the semiconductor chip 200 is mounted on the wiring board, the external connection terminals such as solder bumps can be connected to the wiring board connection surface of the semiconductor chip, the wiring board 50 of FIG. 4 can be used.

Application Example 2 of First Embodiment

Figure 6:
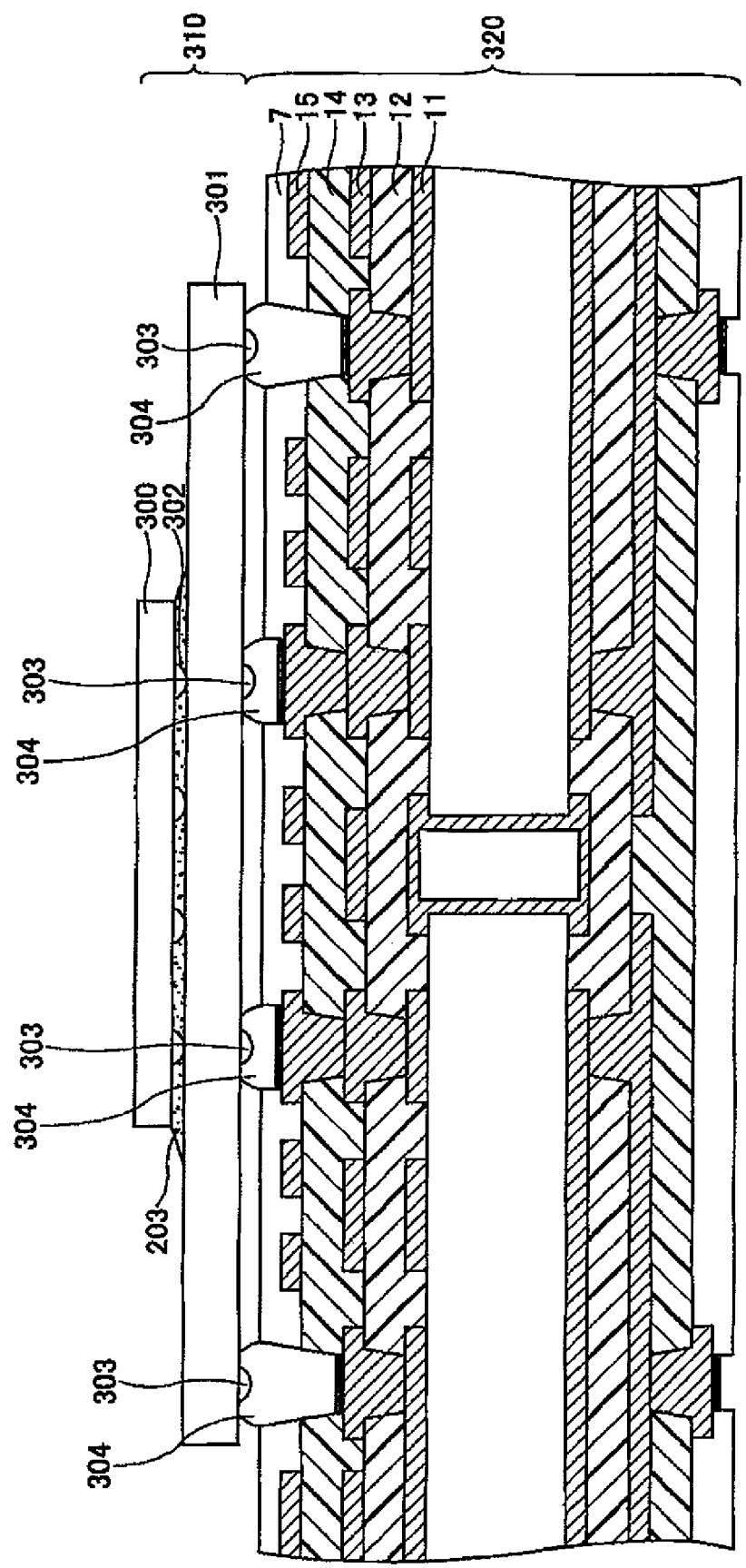
FIG. 6 is a view showing a semiconductor package in which a semiconductor device 310 is mounted on a wiring board 320, in application example 2 of the first embodiment.

FIG. 6 shows another exemplary embodiment of a semiconductor package structure in which a semiconductor device 310 is mounted by solder bumps on the wiring board of the invention. The semiconductor device 310 includes a semiconductor chip 300, an intermediate board 301, and connection bumps 302 and connection terminals 303 for connecting the semiconductor chip 300 and the intermediate board 301. The semiconductor device 310 is mounted on a wiring board 320 by external connection terminals 304 such as solder bumps. In the case where, before the semiconductor device 310 is mounted on the wiring board 320, the external connection terminals such as solder bumps can be connected to the wiring board connection surface of the semiconductor device 310, the wiring board 50 of FIG. 4 can be used.

Second Embodiment

In the first embodiment, only one of adjacent external connection terminals is disposed on a connection pad on the wiring layer which is on the inner side of the outermost wiring layer. By contrast, a second embodiment has a structure where both adjacent external connection terminals are disposed on connection pads on the wiring layer which is on the inner side of the outermost wiring layer.

Figure 3:
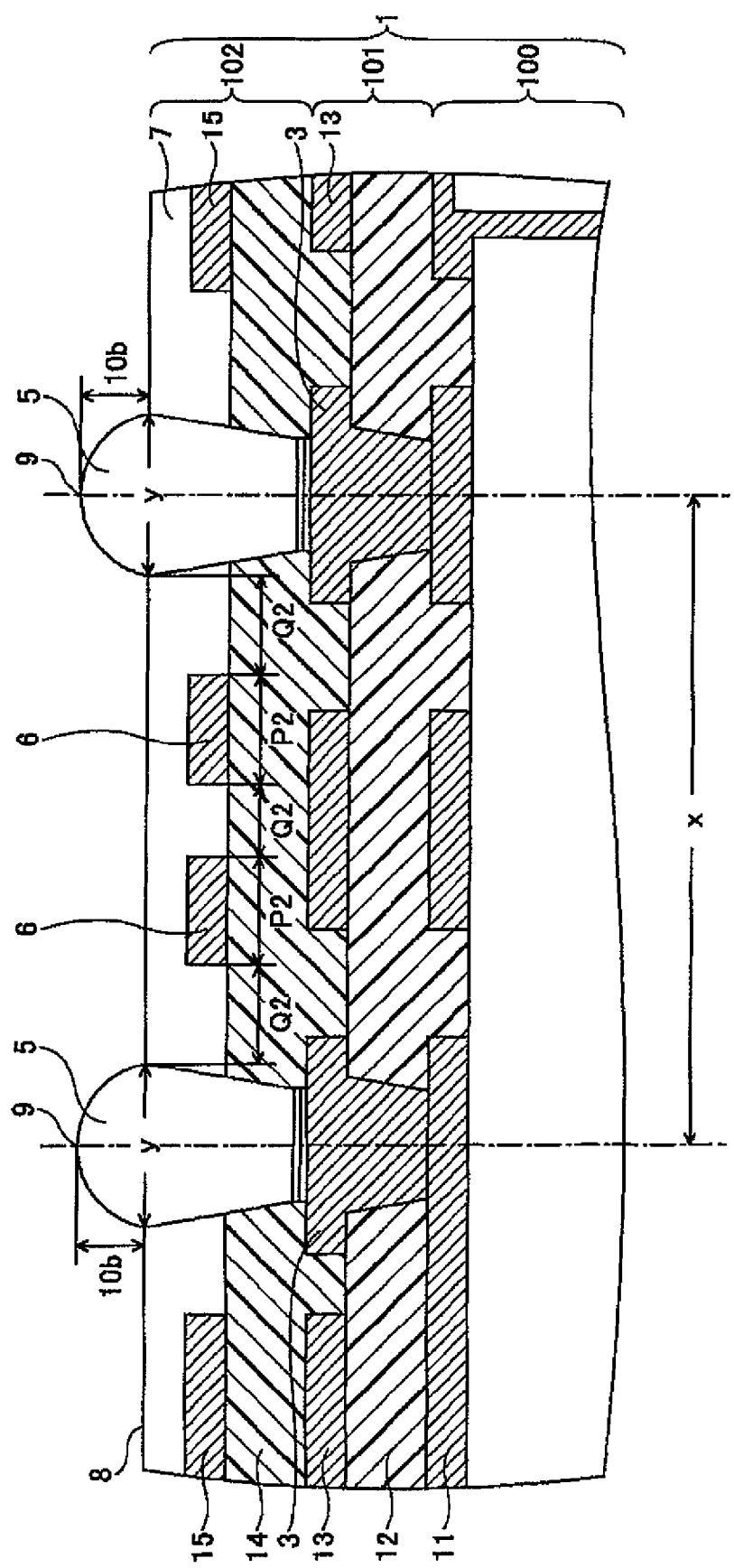
FIG. 3 is a detail view showing a section of a wiring board of a second embodiment of the invention.

FIG. 3 is a view showing in detail a section of the second embodiment, and corresponds to the sectional detail view of FIG. 1E in the first embodiment. In a similar manner as the external connection terminals 5 of FIG. 1E, the external connection terminals 5 are disposed on the connection pad 3 on the second wiring layer 13 which is on the inner side of the outermost wiring layer 15, and passed through the outermost layer 102 to be projected from the board surface 8. A height 10b of the top portion 9 of the external connection terminal 5 from the board surface 8 is adjusted in a similar manner as the first embodiment. The connection pads 3 are disposed in the second wiring layer 13, or alternatively may be disposed in the wiring layer 11 which is further on the inner side, and which is on the core layer. In the case of which a wiring layer is further disposed on the inner side, the connection pads 3 may be disposed on the further inner-side wiring layer. In accordance with the design conditions, the number of stacked layers can be increased or decreased. The core layer 100 and the other stacked layers may be variously configured in a similar manner as the first embodiment, and hence their detailed description is omitted.

Effects of Second Embodiment

Next, realization of enhancement of the wiring density in the outermost wiring layer, and improvement of reliability in the second embodiment will be described with reference to FIG. 3. In the outermost wiring layer 102, overlapping portions of the opening peripheries of the solder resist and the pads are not formed. Therefore, it is possible to avoid a dimensional restriction on the wiring design due to the overlapping portions. In a similar manner as the first embodiment, wirings are disposed at middle positions between adjacent external connection terminals in a narrow portion where the wiring width is near the minimum allowable design value. The bump pitch is indicated by x [μm], the opening diameter of the solder resist is indicated by y [μm], and two wirings are placed. A wiring width P2 [μm] is given by P2=(x−y)/5 from the interval configuration consisting of two wirings and three insulating portions. In an actual manufacturing example, P2=19 μm is obtained, when the bump pitch x=185 μm and the opening diameter y=90 μm. As shown in FIG. 2C, in the related-art case where the connection pads are set on the outermost wiring layer, 15 μm is obtained. Therefore, the wirings of the second embodiment can have a margin of 4 μm. Further, a conduction failure due to lack of the wiring width, and an insulation failure of the insulating portion can be suppressed. Even in the case where, in accordance with the request for high-density mounting of semiconductor devices, wirings are placed so as to have a narrow width at which the conduction resistance of the wirings and the insulation resistance of the insulating layer are in the vicinity of the respective allowable design values, the high density placement of wirings in the outermost layer can be realized without reducing the reliability.

Modification of Second Embodiment

Figure 7:
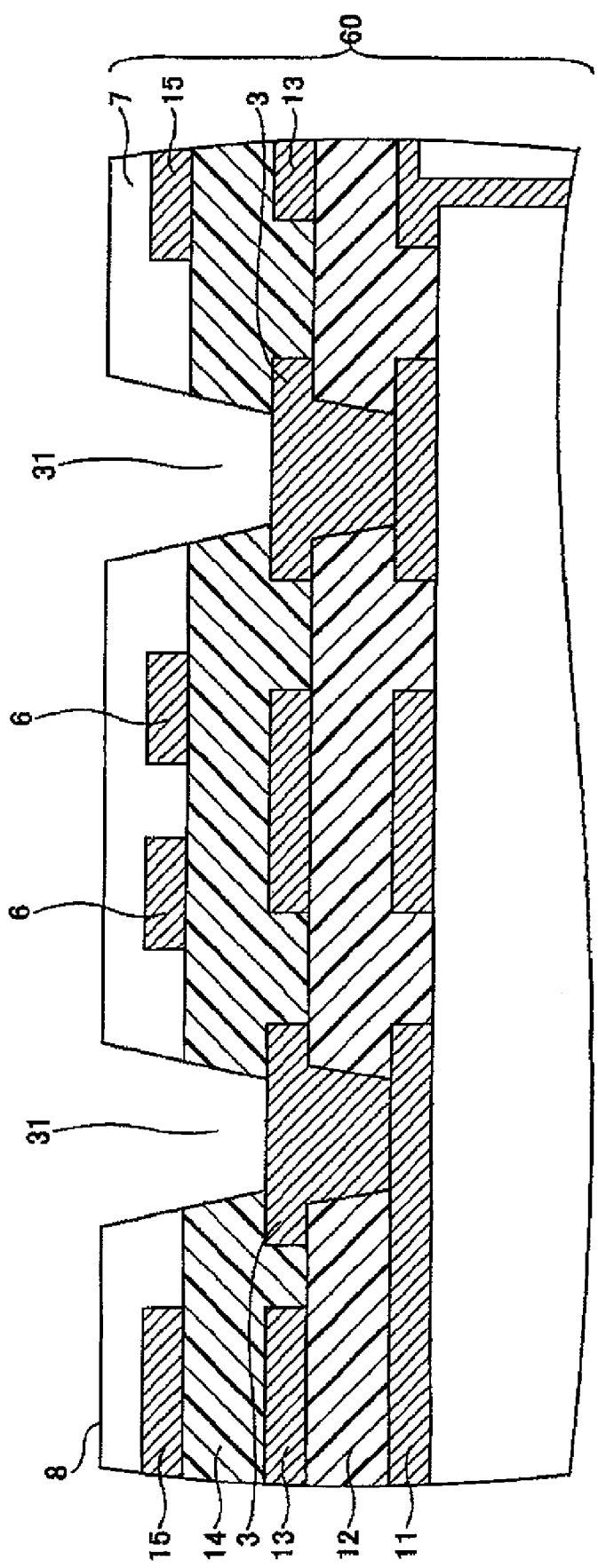
FIG. 7 is a view showing a section of a wiring board 600 of a modification of the second embodiment.

FIG. 7 is a sectional view of the vicinity of the outermost layer in a board corresponding to FIG. 3, and shows a state where the external connection terminals have not yet been disposed. In the case where external connection terminals such as solder bumps are connected to connection terminals of a semiconductor chip or a semiconductor device, it is not necessary to form the external connection terminals which are projected from the surface of the wiring board. Therefore, as shown in FIG. 7, it is possible to use a wiring board 60 having spaces 31 into which external connection terminals are inserted.

Application Example 1 of Second Embodiment

Figure 8:
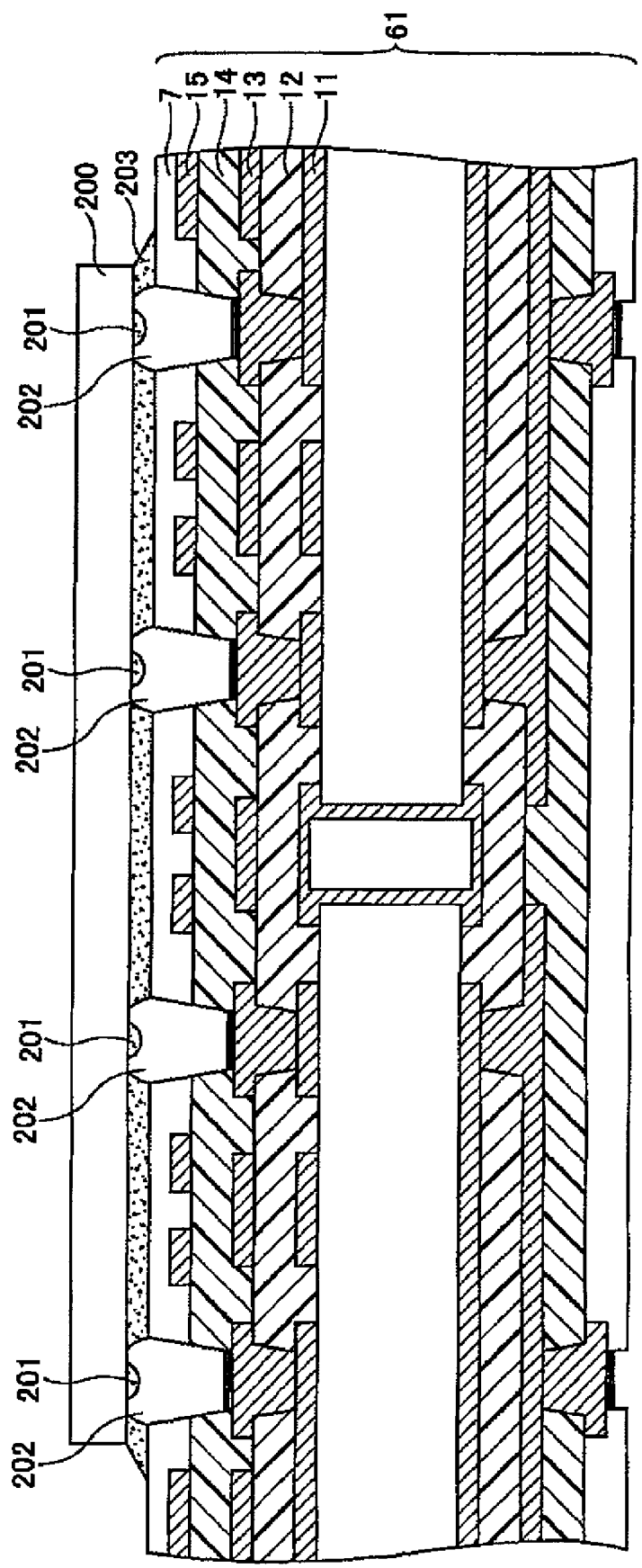
FIG. 8 is a view showing a semiconductor package in which the semiconductor chip 200 is mounted on a wiring board 61, in application example 1 of the second embodiment.

FIG. 8 shows an embodiment of a semiconductor package structure of the second embodiment. As shown in FIG. 8, a semiconductor chip is mounted by solder bumps on the wiring board of the invention. The semiconductor package structure includes the semiconductor chip 200, the connection terminals 201 of the semiconductor chip 200, the external connection terminals 202 such as solder bumps, the filling resin 203, and a wiring board 61. In the case where, before the semiconductor chip 200 is mounted on the wiring board, the external connection terminals such as solder bumps can be connected to the wiring board connection surface of the semiconductor chip, the wiring board of FIG. 7 can be used.

Application Example 2 of Second Embodiment

Figure 9:
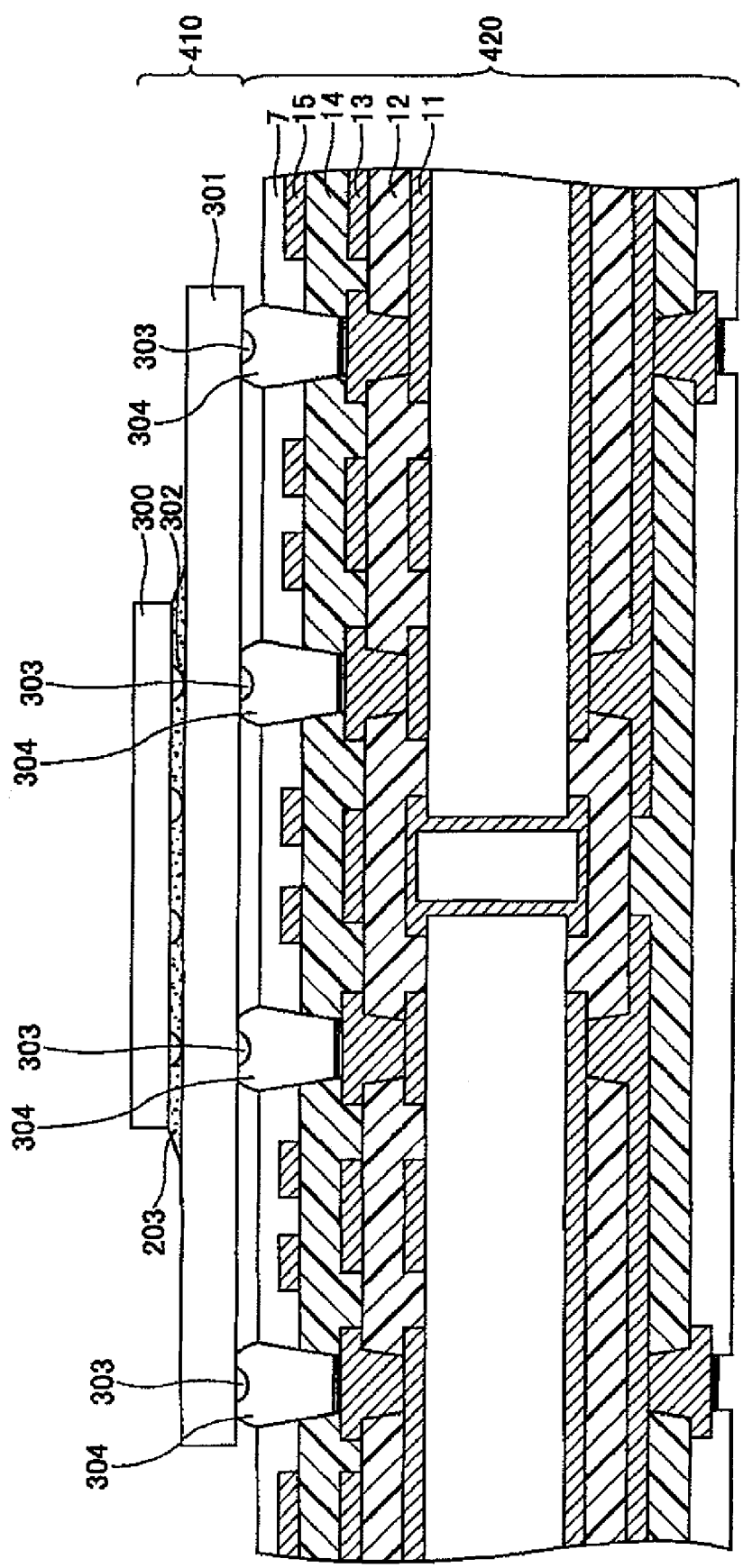
FIG. 9 is a view showing a semiconductor package in which a semiconductor device 410 is mounted on a wiring board 420, in application example 2 of the second embodiment.

FIG. 9 shows an embodiment of a semiconductor package structure in which a semiconductor device 410 is mounted by solder bumps on the wiring board of the invention. The semiconductor device 410 includes the semiconductor chip 300, the intermediate board 301, and the connection bumps 302 and connection terminals 303 for connecting the semiconductor chip 300 and the intermediate board 301. The semiconductor device 410 is mounted on a wiring board 420 by the external connection terminals 304 such as solder bumps. In the case where, before the semiconductor device 410 is mounted on the wiring board 420, the external connection terminals such as solder bumps can be connected to the wiring board connection surface of the semiconductor device 410, the wiring board 60 of FIG. 7 can be used.

Third Embodiment

A third embodiment of the invention is directed to a method for manufacturing the wiring boards of the first and second embodiments. According to the manufacturing method, in a six-layer wiring board in which three layers are stacked on each side of the core layer shown in FIG. 1D, external connection terminals which are passed through the outermost wiring layer 15 are disposed.

The method will be described in detail with reference to FIGS. 10A to 10G. The stacking steps of the wiring board are started by forming (patterning) wirings in the surface copper foil of a copper clad laminated board serving as a core, and completed by a surface treatment for the connection pads.

FIG. 10A is a view showing a state of forming the wirings of the core layer. A process of forming (patterning) wirings is first performed on the surface copper foil of the copper clad laminated board serving as the core. Then, a through hole is plated in order to make the wiring layers on the both faces of the core conductive. For example, steps of forming the wiring layer 11 can be performed by a well-known wiring board forming process (subtractive process). The wiring board forming process is a series of steps including: boring of the through holes; washing if inner walls of the through holes; plating of the interiors of the through holes; electroless copper plating; application of a pattern resist; exposure, developing, and curing of the pattern resist; electrolytic copper plating; removal of the pattern resist; and etching.

FIGS. 10B to 10F are views of steps of forming the second wiring layer on the core layer 100.

Figure 10B:
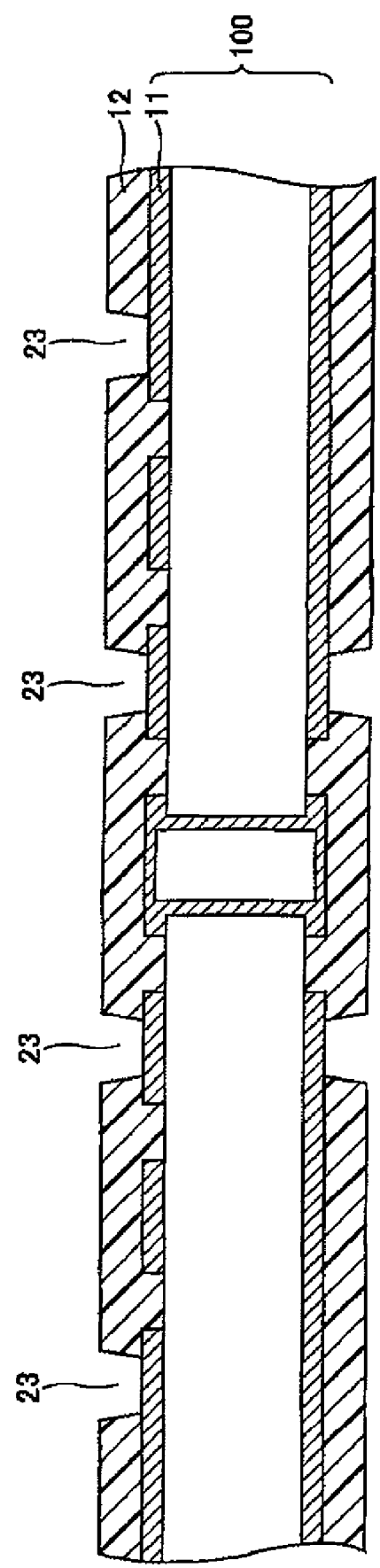
FIG. 10B is a view showing a state where via holes are formed in a first insulating layer 12, in the method for manufacturing the wiring board of the third embodiment.

FIG. 10B shows a state where via holes 23 are formed in the first insulating layer 12. The first insulating layer 12 is disposed on the core layer 100 on which the wirings of FIG. 10A has been formed. In order to electrically connect the wiring layer 11 of the core layer 100 to the wiring layer which is in the next higher layer, thereafter, the via holes 23 are formed by laser processing using carbon dioxide or the like. As the material of the first insulating layer 12, a resin such as epoxy or polyimide can be used. In the laser processing, residuals (not shown) of the processed resist resin adhere to the surfaces of the side walls and bottom of the processed space to cause a possibility that a trouble such as a connection failure may occur, and therefore the residuals are removed away by using a strong alkaline solution (desmear). Next, the wiring layer which is in the next higher layer of the core layer 100 is formed.

FIG. 10C shows a state where electroless copper plating 24 functioning as a seed layer is applied to the whole surface of the first insulating layer 12 in which the via holes 23 are opened.

Figure 10D:
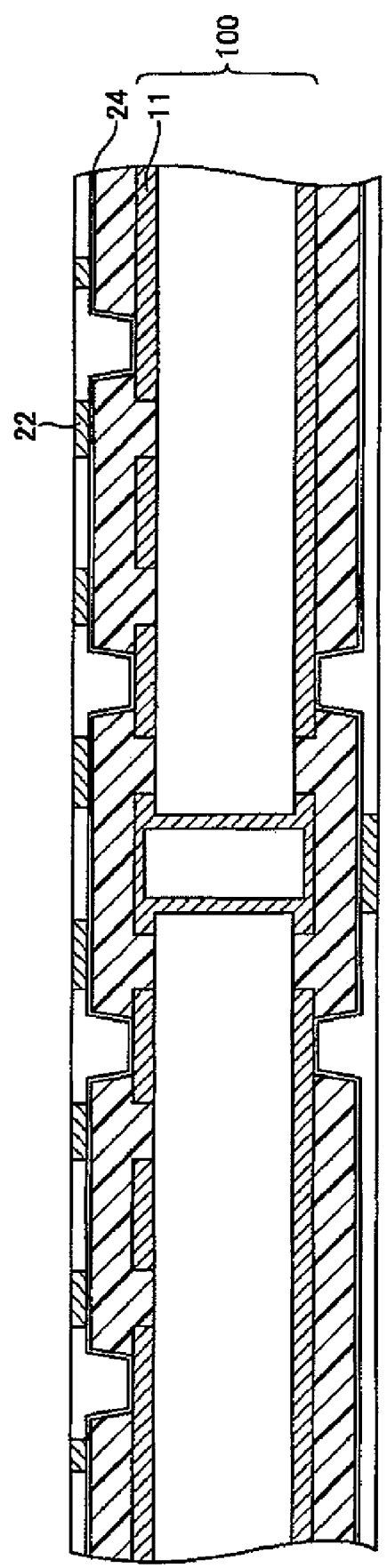
FIG. 10D is a view showing a state where a pattern resist layer 22 is patterned, in the method for manufacturing the wiring board of the third embodiment.

FIG. 10D shows a state where a pattern resist layer 22 for forming the second wiring layer is formed and patterned. Next, electrolytic copper plating is applied.

Figure 10E:
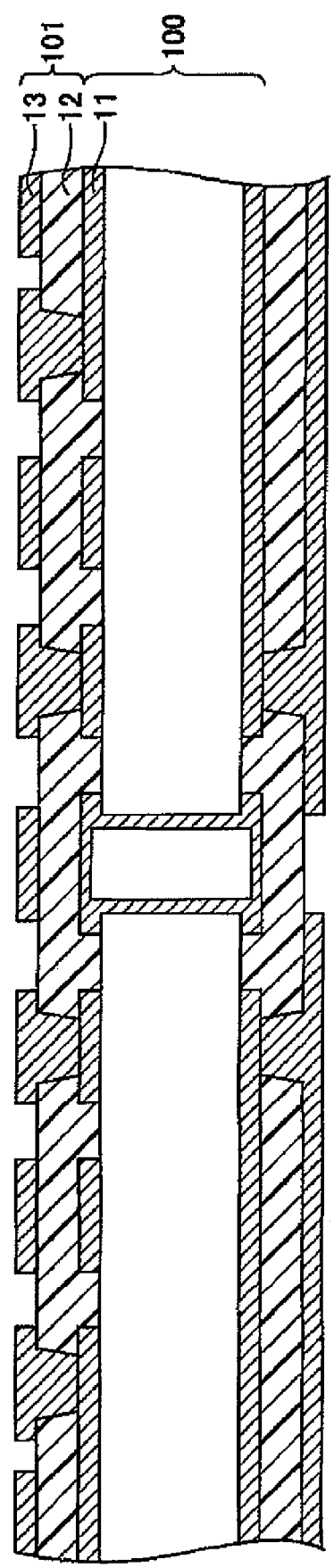
FIG. 10E is a view showing a state where a second wiring layer 13 is formed, in the method for manufacturing the wiring board of the third embodiment.

FIG. 10E shows a state where the second wiring layer 13 on the core layer is formed. A wiring layer is formed by electro copper plating in portions corresponding to the patterning of the pattern resist layer 22 shown in FIG. 10D. Thereafter, the electroless copper portion functioning as a seed layer, and the pattern resist layer are removed away to form the second wiring layer 13.

Figure 10F:
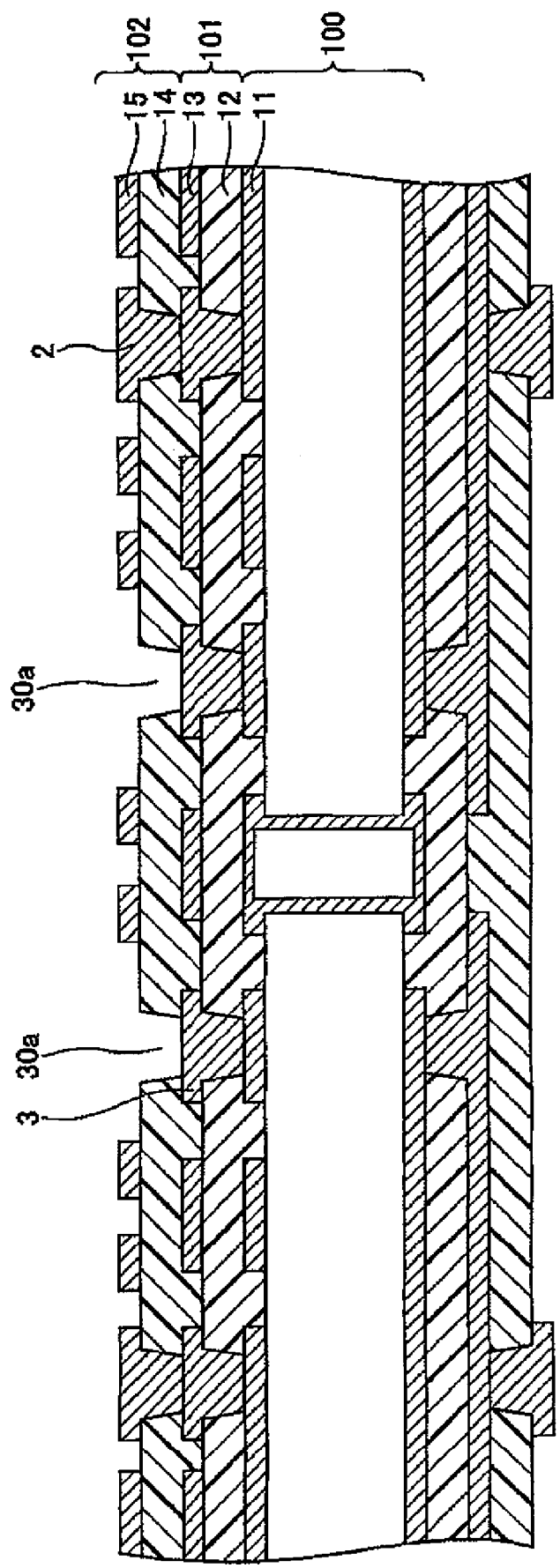
FIG. 10F is a view showing a state where an outermost wiring layer 15 is formed, in the method for manufacturing the wiring board of the third embodiment.

FIG. 10F shows a state where the outermost wiring layer 15 is formed. In order to further form a wiring layer above the second wiring layer 13 on the core layer, similarly with the case of forming the second wiring layer 13 on the core layer, the second insulating layer 14 is stacked, electroless copper plating is applied, a pattern resist layer (not shown) is formed, and electrolytic copper plating is applied, thereby forming the third wiring layer 15 on the core layer. In the steps of forming the wiring layer, "spaces which are formed while being passed through the outermost wiring layer from the connection pads toward the surface of the wiring board, and into which external connection terminals are to be inserted" 30a are disposed. In the third embodiment, the third wiring layer 15 on the core layer corresponds to the outermost wiring layer.

FIG. 10G shows a state where a solder resist layer is formed in the surface of the wiring board. Processes of application, exposure, developing, and curing of the solder resist layer 7 are performed on the surface of the outermost wiring layer 15, to form an outer shape of the solder resist layer. Simultaneously, openings 30b which are passed through the outermost layer 102 are formed. At this time, it is necessary to position between openings 30a for the connection pads 3 which are disposed on the wiring layer (in the embodiment, corresponding to the second wiring layer on the core layer) 13, and the openings 30b in the solder resist layer 7.

Figure 10H:
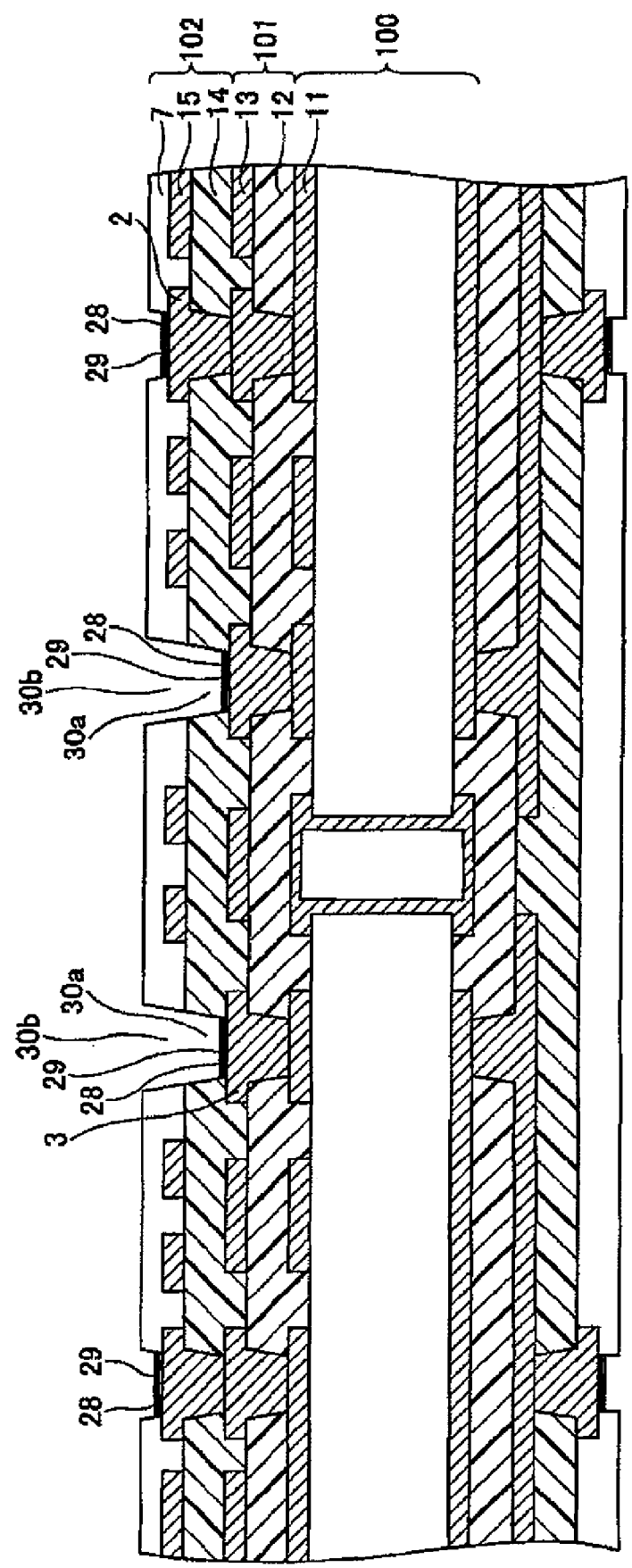
FIG. 10H is a view showing a state where a surface treatment is performed on connection pads, in the method for manufacturing the wiring board of the third embodiment.

FIG. 10H shows a state where a surface treatment is performed on the connection pads. Nickel plating 28 and gold plating 29 are applied by electroless plating on the surfaces of the connection pads 2 or 3 disposed on the outermost wiring layer 15 or on the wiring layer which is on the inner side of the outermost wiring layer 15.

Figure 10I:
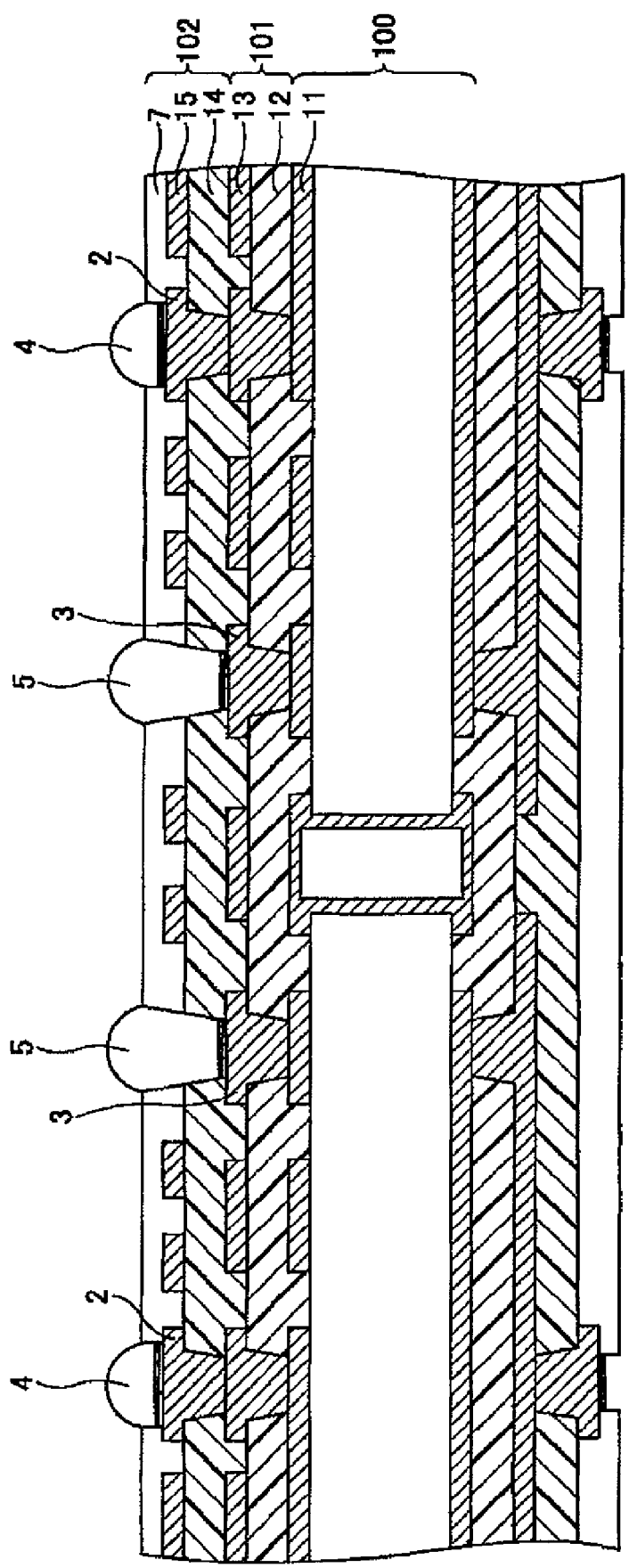
FIG. 10I is a view showing a state where external connection terminals are formed on the wiring board, in the method for manufacturing the wiring board of the third embodiment.

FIG. 10I shows a state where the external connection terminals are formed on the wiring board. By using a material such as solder, the external connection terminals 5 which are passed through the outermost layer 102 are formed on the connection pads 3, and the external connection terminals 4 on the outermost wiring layer 15 are formed on the connection pads 2, thereby completing the method for manufacturing the wiring board of the present invention.

The third embodiment shows the external connection terminals which are formed to be connected to the connection pads disposed on the second wiring layer on the core layer. As required, connection pads may be disposed on a wiring layer which is further on the inner side, and the external connection terminals may be formed thereon.

As a post-process of the third embodiment, a semiconductor chip or a semiconductor device may be mounted on the wiring board.

Effects of Third Embodiment

The wiring board forming steps can improve a function and reliability of a method for manufacturing an electronic component having minimum dimensions which are obtained by the surface mounting design based on the high-density wiring. Further, the wiring board forming steps can improve a yield of the wiring board.

Modification 1 of Third Embodiment

Modification 1 of a method for manufacturing a wiring board corresponding to FIG. 4 will be described. In the case where external connection terminals such as solder bumps are connected to connection terminals of a semiconductor chip or a semiconductor device, the wiring board can be formed without the step of connecting the external connection terminals. The wiring board can be manufactured with the spaces 30 into which the external connection terminals are to be inserted. Therefore, the forming steps of the wiring board can be simplified, and the reliability of the wiring board can be improved. In a post-process, a semiconductor chip or a semiconductor device can be mounted on the wiring board. In a reflow step, the semiconductor chip or the semiconductor device is connected electrically and mechanically to the wiring board through the external connection terminals such as solder bumps. Thereafter, the space between the semiconductor chip or the semiconductor device and the wiring board is filled with a resin, thereby completing the mounting.

Modification 2 of Third Embodiment

Modification 2 of a method for manufacturing a wiring board corresponding to FIG. 7 will be described. In the case where external connection terminals such as solder bumps are connected to connection terminals of a semiconductor chip or semiconductor device, the wiring board can be produced without the step of connecting the external connection terminals. The wiring board can be manufactured with the spaces 31 into which the external connection terminals are to be inserted. Therefore, the forming steps of the wiring board can be simplified, and the reliability of the wiring board can be improved. In a post-process, a semiconductor chip or a semiconductor device can be mounted on the wiring board. In a reflow step, the semiconductor chip or the semiconductor device is connected electrically and mechanically to the wiring board through the external connection terminals such as solder bumps. Thereafter, the space between the semiconductor chip or the semiconductor device and the wiring board is filled with a resin, thereby completing the mounting.

Modification 3 of Third Embodiment

Modification 3 of a method for manufacturing a wiring board in which the solder resist layer in the surface of the wiring board and the insulating layer that is below the solder resist layer are simultaneously bored will be described.

Referring to FIG. 4 or FIG. 7, the solder resist layer 7 and the insulating layer that is below the solder resist layer are bored to form the spaces 30 or 31 into which the external connection terminals are to be inserted. In the boring for forming the spaces, an electrical or mechanical method can be used. For example, the two layers of the solder resist layer and the insulating layer can be simultaneously bored by employing laser using carbon dioxide, yttrium aluminum garnet (YAG), or excimer. According to such a boring method, it is possible to attain effects such as improvement of the manufacturing yield due to relaxation of the design rule, and that of the manufacturing yield of the step of forming the solder resist layer 7. The relaxation of the design rule is caused by the accuracy of positioning the solder resist layer 7 with respect to the insulating layer.

Although the exemplary embodiments of the invention have been described in detail, the invention is not limited to the above-described embodiments, and various modifications and replacements can be applied to the above-described embodiments without departing from the scope of the spirit of the invention.

What is claimed is:

1. A wiring board comprising:
   a plurality of wiring layers, including a first wiring layer that is an outermost wiring layer closest to a surface of the wiring board, and a second wiring layer that is on an inner side of the first wiring layer, farther away from the surface of the wiring board than the first wiring layer;
   a plurality of insulating layers which are alternately stacked with said wiring layers, and in which said wiring layers are electrically connected to one another through via holes formed in said insulating layers;
   a connection pad which is disposed on the second wiring layer; and
   an external connection terminal which is disposed on said connection pad, and which is projected from a surface of said wiring board, wherein
   said external connection terminal is passed through said first wiring layer.

2. A semiconductor package wherein
   a semiconductor chip or a semiconductor device is mounted on the wiring board according to claim 1 by using said external connection terminal.

3. The wiring board according to claim 1, wherein
   the first wiring layer is covered with a solder resist layer,
   a space for exposing the connection pad is formed by integrally penetrating through the solder resist layer, the first wiring layer and an insulating layer, and
   the external connection terminal is provided on the connection pad exposed in the space.

4. The wiring board according to claim 3, wherein
another connection pad is provided on the first wiring layer,
another space for exposing the other connection pad is formed on the solder resist layer, and
another external connection terminal is provided on the other connection pad exposed in the other space.

5. The wiring board according to claim 4, wherein
the first wiring layer includes a wiring pattern, and
the wiring pattern is provided between the other connection pad and the space adjacent to the other connection pad.

6. A method for manufacturing a wiring board in which a plurality of wiring layers and a plurality of insulating layers are alternately stacked, the plurality of wiring layers including a first wiring layer that is an outermost wiring layer closest to a surface of the wiring board, and a second wiring layer that is on an inner side of the first wiring layer, farther away from the surface of the wiring board than the first wiring layer, and said wiring layers are electrically connected to one another through via holes formed in said insulating layers, said method comprising:
    a step of forming the first wiring layer including a solder resist layer and an insulating layer which is below said solder resist layer;
    a step of forming a connection pad which is disposed on the second wiring layer; and
    a step of forming a space so as to be passed through the first wiring layer, in a direction from the connection pad toward a surface of said wiring board, wherein
    said space is formed for inserting an external connection terminal for connecting a semiconductor chip or semiconductor device mounted on said wiring board.

7. The method for manufacturing the wiring board according to claim 6, wherein
    said space is formed by simultaneously boring said solder resist layer and said insulating layer.

8. The method for manufacturing the wiring board according to claim 7, wherein
    said space is formed by using a laser.

9. A wiring board comprising:
    a plurality of wiring layers, including a first wiring layer that is an outermost wiring layer closest to a surface of the wiring board, and a second wiring layer that is on an inner side of the first wiring layer, farther away from the surface of the wiring board than the first wiring layer;
    a plurality of insulating layers which are alternately stacked with said wiring layers, and in which said wiring layers are electrically connected to one another through via holes formed in said insulating layers;
    a connection pad which is disposed on the second wiring layer; and
    a space which is formed so as to be passed through said first wiring layer, in a direction from the connection pad toward a surface of said wiring board, wherein
    said space is formed for exposing the connection pad and inserting an external connection terminal for connecting a semiconductor chip or semiconductor device mounted on said wiring board.

10. A semiconductor package, wherein
the semiconductor chip or semiconductor device which has said external connection terminal is mounted on the wiring board according to claim 9, and
said external connection terminal is connected to said connection pad of the wiring board.

11. The wiring board according to claim 9, wherein
the first wiring layer is covered with a solder resist layer, and
the space for exposing the connection pad and inserting the external connection terminal is formed by integrally penetrating through the solder resist layer, the first wiring layer and an insulating layer.

12. The wiring board according to claim 11, wherein
another connection pad is provided on the first wiring layer, and
another space for exposing the other connection pad is formed on the solder resist layer.

13. The wiring board according to claim 12, wherein
the first wiring layer includes a wiring pattern, and
the wiring pattern is provided between the other connection pad and the space adjacent to the other connection pad.

14. A method for manufacturing a wiring board in which a plurality of wiring layers and a plurality of insulating layers are alternately stacked, the plurality of wiring layers including a first wiring layer that is an outermost wiring layer closest to a surface of the wiring board, and a second wiring layer that is on an inner side of the first wiring layer, farther away from the surface of the wiring board than the first wiring layer, and said wiring layers are electrically connected to one another through via holes formed in said insulating layers, said method comprising:
    a step of forming an external connection terminal for connecting a semiconductor chip or semiconductor device mounted on said wiring board;
    a step of connecting said external connection terminal to a connection pad which is disposed on the second wiring layer; and
    a step of passing said external connection terminal through said first wiring layer.

* * * * *